United States Patent
Fan et al.

(10) Patent No.: US 10,706,767 B2
(45) Date of Patent: Jul. 7, 2020

(54) SHIFT REGISTER UNIT CIRCUIT, DRIVING METHOD THEREOF, GATE DRIVE CIRCUIT AND DISPLAY DEVICE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Jun Fan, Beijing (CN); Wei Li, Beijing (CN); Fuqiang Li, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (MN)

( * ) Notice: Subject to any disclaimer, the term of this patent is extended or adjusted under 35 U.S.C. 154(b) by 131 days.

(21) Appl. No.: 15/756,975

(22) PCT Filed: Aug. 31, 2017

(86) PCT No.: PCT/CN2017/099871
§ 371 (c)(1),
(2) Date: Mar. 1, 2018

(87) PCT Pub. No.: WO2018/129932
PCT Pub. Date: Jul. 19, 2018

(65) Prior Publication Data
US 2019/0057637 A1 Feb. 21, 2019

(30) Foreign Application Priority Data
Jan. 16, 2017 (CN) .......................... 2017 1 0028509

(51) Int. Cl.
G09G 3/20 (2006.01)
G11C 19/28 (2006.01)
G11C 19/18 (2006.01)

(52) U.S. Cl.
CPC ............. *G09G 3/2092* (2013.01); *G09G 3/20* (2013.01); *G11C 19/184* (2013.01); *G11C 19/28* (2013.01);
(Continued)

(58) Field of Classification Search
None
See application file for complete search history.

(56) References Cited

U.S. PATENT DOCUMENTS

2010/0177023 A1  7/2010  Han
2014/0176410 A1* 6/2014  Ma ........................ G09G 3/3622
                                                            345/92

(Continued)

FOREIGN PATENT DOCUMENTS

CN    102800289 A    11/2012
CN    103226981 A    7/2013
(Continued)

OTHER PUBLICATIONS

International Search Report received for PCT Patent Application No. PCT/CN2017/099871, dated Dec. 1, 2017, 8 pages (3 pages of English Translation and 5 pages of Original Document).

(Continued)

*Primary Examiner* — Ifedayo B Iluyomade
(74) *Attorney, Agent, or Firm* — Womble Bond Dickinson (US) LLP (57) ABSTRACT

A shift register unit circuit includes an input circuit configured to supply an active potential to a first node responsive to an input pulse from an input terminal being active and to supply an inactive potential to the first node responsive to a (Continued)

reset pulse from a reset terminal being active; an output circuit configured to supply a first clock signal to an output terminal responsive to a second node being at the active potential and to cause a potential at the second node to be changed from the active potential to further away from the inactive potential responsive to a transition of a potential at the output terminal transitioning from the inactive potential to the active potential; and a potential control circuit configured to restrict a change in the potential at the first node caused by the transition of the potential at the output terminal from the inactive potential to the active potential.

13 Claims, 8 Drawing Sheets (52) U.S. Cl.
CPC ............ *G09G 2310/0267* (2013.01); *G09G 2310/0286* (2013.01); *G09G 2310/08* (2013.01)

(56) References Cited

U.S. PATENT DOCUMENTS

| | | |
|---|---|---|
| 2015/0043703 A1 | 2/2015 | Tan et al. |
| 2015/0179277 A1 | 6/2015 | Pai et al. |
| 2015/0302934 A1* | 10/2015 | Qi .................. G11C 19/184 377/54 |
| 2016/0266699 A1 | 9/2016 | Zhao et al. |
| 2016/0268004 A1 | 9/2016 | Li et al. |
| 2017/0039971 A1 | 2/2017 | Huang |
| 2017/0269769 A1 | 9/2017 | Hu |

FOREIGN PATENT DOCUMENTS

| | | |
|---|---|---|
| CN | 103474038 A | 12/2013 |
| CN | 103761992 A | 4/2014 |
| CN | 103996367 A | 8/2014 |
| CN | 203760057 U | 8/2014 |
| CN | 104021769 A | 9/2014 |
| CN | 203882580 U | 10/2014 |
| CN | 104282285 A | 1/2015 |
| CN | 104425033 A | 3/2015 |
| CN | 104700805 A | 6/2015 |
| CN | 105185290 A | 12/2015 |
| CN | 106297697 A | 1/2017 |
| CN | 106601176 A | 4/2017 |
| KR | 10-2007-0000832 A | 1/2007 |
| WO | 2018/129932 A1 | 7/2018 |

OTHER PUBLICATIONS

Office Action received for Chinese Patent Application No. 201710028509.0, dated Mar. 4, 2019, 26 pages (14 pages of English Translation and 12 pages of Office Action).

* cited by examiner

SHIFT REGISTER UNIT CIRCUIT, DRIVING METHOD THEREOF, GATE DRIVE CIRCUIT AND DISPLAY DEVICE

CROSS-REFERENCE TO RELATED APPLICATIONS

The present application is the U.S. national phase entry of PCT/CN2017/099871, with an international filing date of Aug. 31, 2017, which claims the benefit of Chinese Patent Application No. 201710028509.0, filed on Jan. 16, 2017, the entire disclosures of which are incorporated herein by reference.

TECHNICAL FIELD

This disclosure relates to generation of gate drive signals, and more particularly to a shift register unit circuit, a driving method for the shift register unit circuit, a gate drive circuit, and a display device.

BACKGROUND

A shift register including a plurality of cascaded shift register unit circuits may operate as a gate drive circuit of a display panel. Under high temperature (e.g., 70 to 85° C.), the leakage current of some of the transistors in the shift register unit circuit may significantly increase to, for example, 2 to 3 orders of magnitude larger than at room temperature. This can result in drastic changes in the potential at some of the internal nodes, and thus in the deterioration of the output gate drive signal. As a result, the display panel has poor high-temperature reliability.

SUMMARY

It would be advantageous to provide a shift register unit circuit that may solve one or more of the above problems.

According to an aspect of the present disclosure, a shift register unit circuit is provided comprising: an input circuit configured to supply an active potential from a first scan level terminal to a first node in response to an input pulse from an input terminal being active, and to supply an inactive potential from a second scan level terminal to the first node in response to a reset pulse from a reset terminal being active; an output circuit configured to supply a first clock signal from a first clock terminal to an output terminal in response to a second node being at the active potential, and to cause a potential at the second node to be changed from the active potential to further away from the inactive potential in response to a potential at the output terminal transitioning from the inactive potential to the active potential; and a potential control circuit configured to restrict a change in a potential at the first node caused by the transition of the potential at the output terminal from the inactive potential to the active potential.

In some embodiments, the potential control circuit is configured to bring the first node out of conduction with the second node in response to a change in the potential at the second node exceeding a threshold.

In some embodiments, the potential control circuit comprises a first control transistor having a gate connected to a potential control terminal, a first electrode connected to the first node, and a second electrode connected to the second node. The first control transistor is configured to be turned on in response to a control signal from the potential control terminal being active, and to be turned off in response to the change in the potential at the second node exceeding the threshold.

In some embodiments, the first node is directly connected to the second node, and the potential control circuit comprises a second capacitor connected between the second node and a first reference level terminal for supplying the inactive potential.

In some embodiments, the potential control circuit is further configured to supply an active potential from a second reference level terminal to the second scan level terminal in response to the output terminal being at the active potential.

In some embodiments, the potential control circuit further comprises a second control transistor having a gate connected to the output terminal, a first electrode connected to the second reference level terminal, and a second electrode connected to the second scan level terminal.

In some embodiments, the input circuit comprises: a first transistor having a gate connected to the input terminal, a first electrode connected to the first node, and a second electrode connected to the first scan level terminal; and a second transistor having a gate connected to the reset terminal, a first electrode connected to the second scan level terminal, and a second electrode connected to the first node.

In some embodiments, the output circuit comprises: a third transistor having a gate connected to the second node, a first electrode connected to the output terminal, and a second electrode connected to the first clock terminal; and a first capacitor connected between the second node and the output terminal.

In some embodiments, the output circuit is further configured to supply the inactive potential from the first reference level terminal to the output terminal in response to a third node being at the active potential.

In some embodiments, the output circuit further comprises a fourth transistor having a gate connected to the third node, a first electrode connected to the first reference level terminal, and a second electrode connected to the output terminal.

In some embodiments, the shift register unit circuit further comprises a node control circuit configured to set the third node at the inactive potential in response to the second node being at the active potential and to set the third node at the active potential in response to the second node being at the inactive potential.

In some embodiments, the node control circuit comprises: a sixth transistor having a gate connected to the second node, a first electrode connected to the first reference level terminal, and a second electrode connected to the third node; a seventh transistor having a gate connected to a second clock terminal for supplying a second clock signal having an opposite phase to the first clock signal, a first electrode connected to the third node, and a second electrode connected to the second clock terminal; and a third capacitor connected between the third node and the first reference level terminal.

In some embodiments, the node control circuit is further configured to set the second node at the inactive potential in response to the third node being at the active potential.

In some embodiments, the node control circuit further comprises a fifth transistor having a gate connected to the third node, a first gate connected to the second node, and a second electrode connected to the first reference level terminal.

According to another aspect of the disclosure, a method of driving the shift register unit circuit as described above is provided. The method comprises: responsive to the input pulse from the input terminal being active, supplying the active potential from the first scan level terminal to the first node; responsive to the second node being at the active potential, supplying the first clock signal from the first clock terminal to the output terminal; responsive to the output terminal transitioning from being at the inactive potential to being at the active potential, causing the potential at the second node to be changed from the active potential to further away from the inactive potential; restricting a change in the potential at the first node caused by the transition of the potential at the output terminal from the inactive potential to the active potential; and responsive to the reset pulse from the reset terminal being active, supplying the inactive potential from the second scan level terminal to the first node.

According to yet another aspect of the disclosure, a gate drive circuit is provided comprising a plurality of cascaded shift register unit circuits as described above.

According to still yet another aspect of the disclosure, a display device is provided comprising the gate drive circuit as described above.

These and other aspects of the present disclosure will be apparent from and elucidated with reference to the embodiment(s) described hereinafter.

DETAILED DESCRIPTION

It will be understood that, although the terms first, second, third etc. may be used herein to describe various elements, components and/or sections, these elements, components and/or sections should not be limited by these terms. These terms are only used to distinguish one element, component or section from another element, component or section. Thus, a first element, component or section discussed below could be termed a second element, component or section without departing from the teachings of the present disclosure.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element is referred to as being "connected to" or "coupled to" another element, it can be directly connected or coupled to the other element, or intervening elements may be present. In contrast, when an element is referred to as being "directly connected to" or "directly coupled to" another element, there are no intervening elements present. In contrast, when an element is referred to as being "directly connected to" or "directly coupled to" another element, there are no intervening elements present.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure 1:
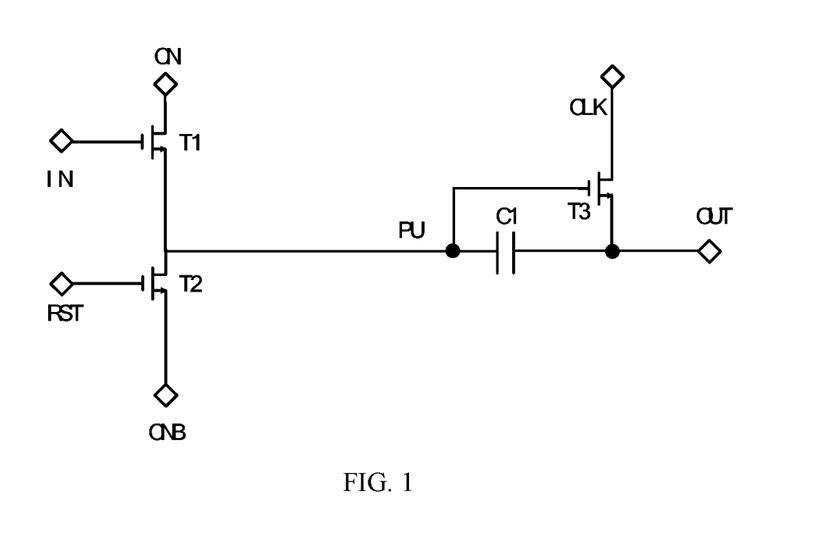
FIG. 1 is a circuit diagram of a portion of a typical shift register unit circuit.

FIG. 1 is a circuit diagram of a portion of a typical shift register unit circuit. The following explains how the performance of the shift register unit circuit is affected by high temperature conditions with reference to FIG. 1.

As shown in FIG. 1, this circuit portion includes a first transistor T1, a second transistor T2, a third transistor T3, and a capacitor C1. When an input terminal IN is applied with a high-level voltage, a high-level voltage from a first scan level terminal CN is supplied to a pull-up node PU through the first transistor T1 and the third transistor T3 is turned on. The turned-on third transistor T3 transmits a clock signal from a clock terminal CLK to an output terminal OUT so that the potential at the output terminal OUT varies with the clock signal. When the potential at the output terminal OUT transitions from a low level to a high level, the potential at the pull-up node PU further rises due to a self-boosting effect of the capacitor C1. At this point, there may be a typical operation condition for the second transistor T2: Vgs=0 V and Vds=28 V, where Vgs is the gate-source voltage and Vds is the drain-source voltage. In this case, there is a leakage current flowing from the pull-up node PU through the second transistor T2 to a second scan level terminal CNB, which in turn causes a drop in the potential at the pull-up node PU. This may result in deterioration of a pulse signal output from the output terminal OUT, for example, the falling edge becomes not so steep. In particular, under high temperature conditions (e.g., 70-85° C.), the leakage current of the second transistor T2 may increase by 2 to 3 orders of magnitude as compared to under room temperature due to the variation in the characteristics of the transistor. This may cause considerable deterioration of the pulse signal output by the output terminal OUT.

Figure 2:
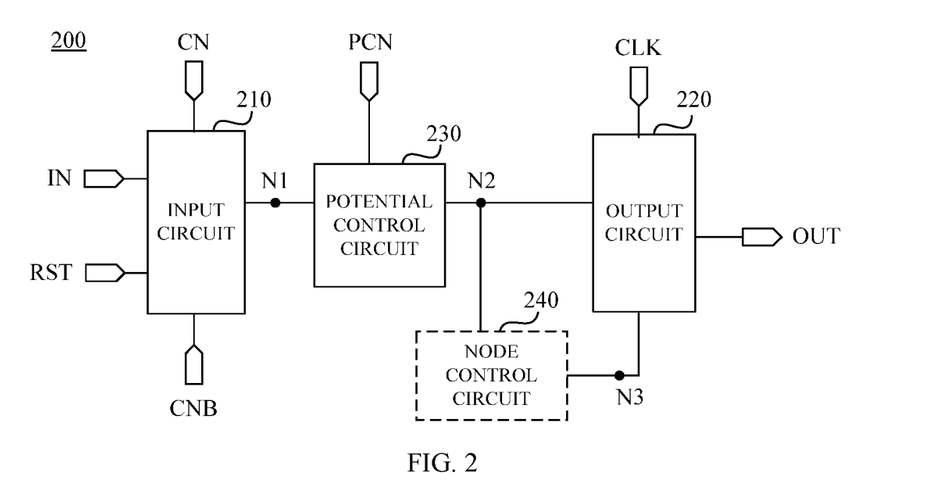
FIG. 2 is a block diagram of a shift register unit circuit according to an embodiment of the present disclosure.

FIG. 2 is a block diagram of a shift register unit circuit 200 according to an embodiment of the present disclosure. Referring to FIG. 2, the shift register unit circuit 200 includes an input circuit 210, an output circuit 220, a potential control circuit 230, and a node control circuit 240.

The input circuit 210 is configured to supply an active potential from a first scan level terminal CN to a first node N1 in response to an input pulse from an input terminal IN being active. The input circuit 210 is further configured to supply an inactive potential from a second scan level terminal CNB to the first node N1 in response to a reset pulse from a reset terminal RST being active.

The output circuit 220 is configured to supply a first clock signal from a first clock terminal CLK to an output terminal OUT in response to a second node N2 being at the active potential. The output circuit 220 is further configured to cause a potential at the second node N2 to be changed from the active potential to further away from the inactive potential in response to a potential at the output terminal OUT transitioning from the inactive potential to the active potential.

The potential control circuit 230 is configured to restrict a change in a potential at the first node N1 caused by the transition of the potential at the output terminal OUT from the inactive potential to the active potential. As will be discussed later, this can suppress the leakage current in the circuit that flows from the first node N1, and thus improve the performance of the shift register unit circuit 200 under high temperature conditions.

The node control circuit 240 as indicated by a dotted line box is not so relevant to the inventive concept of the present disclosure and will be described later.

The term "active potential" as used herein refers to a potential at which the circuit element(s) (e.g., a transistor) involved is enabled. In contrast, the term "inactive potential" refers to a potential at which the circuit element involved is disabled. For n-type transistors, the active potential is high and the inactive potential is low. For p-type transistors, the active potential is low and the inactive potential is high.

Figure 3:
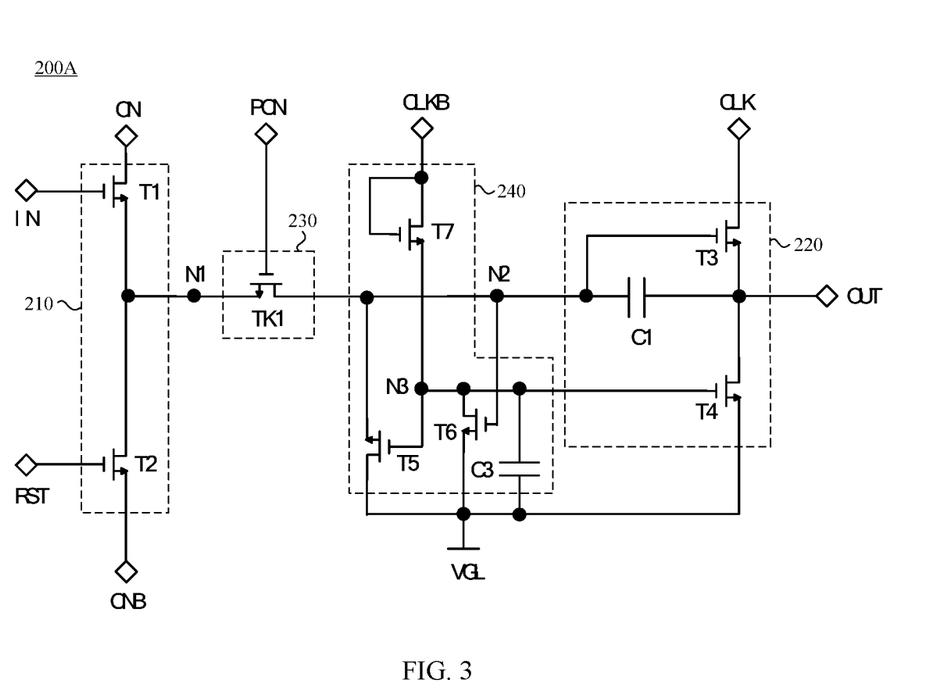
FIG. 3 is a circuit diagram of an example circuit of the shift register unit circuit as shown in FIG. 2.

FIG. 3 is a circuit diagram of an example circuit 200A of the shift register unit circuit 200 shown in FIG. 2. An example configuration of the shift register unit circuit 200 is described below with reference to FIG. 3.

The input circuit 210 includes a first transistor T1 and a second transistor T2. The first transistor T1 has a gate connected to the input terminal IN, a first electrode connected to the first node N1, and a second electrode connected to the first scan level terminal CN. The second transistor T2 has a gate connected to the reset terminal RST, a first electrode connected to the second scan level terminal CNB, and a second electrode connected to the first node N1.

The output circuit 220 includes a third transistor T3 and a first capacitor C1. The third transistor T3 has a gate connected to the second node N2, a first electrode connected to the output terminal OUT, and a second electrode connected to the first clock terminal CLK. The first capacitor C1 is connected between the second node N2 and the output terminal OUT. In this example, the output circuit 220 is further configured to supply an inactive potential from a first reference level terminal VGL to the output terminal OUT in response to a third node N3 being at the active potential. Specifically, as shown in FIG. 3, the output circuit 220 further includes a fourth transistor T4 having a gate connected to the third node N3, a first electrode connected to the first reference level terminal VGL, and a second electrode connected to the output terminal OUT.

In this example, the potential control circuit 230 is configured to bring the first node N1 out of conduction with the second node N2 in response to a change in the potential at the second node N2 exceeding a threshold. Specifically, the potential control circuit 230 includes a first control transistor TK1 having a gate connected to a potential control terminal PCN, a first electrode connected to the first node N1, and a second electrode connected to the second node N2. The first control transistor TK1 is configured to be turned on in response to a control signal from the potential control terminal PCN being active. The first control transistor TK1 is further configured to be turned off in response to the change in the potential at the second node N2 exceeding the threshold.

The node control circuit 240 is configured to set the third node N3 at the inactive potential in response to the second node N2 being at the active potential and to set the third node N3 at the active potential in response to the second node N2 being at the inactive potential. Specifically, in the example of FIG. 3, the node control circuit 240 includes a sixth transistor T6, a seventh transistor T7, and a third capacitor C3. The sixth transistor T6 has a gate connected to the second node N2, a first electrode connected to the first reference level terminal VGL, and a second electrode connected to the third node N3. The seventh transistor T7 has a gate connected to a second clock terminal CLKB for supplying a second clock signal that has a phase opposite to the first clock signal, a first electrode connected to the third node N3, and a second electrode connected to the second clock terminal CLKB. The third capacitor C3 is connected between the third node N3 and the first reference level terminal VGL.

In some embodiments, the node control circuit 240 is further configured to set the second node N2 at the inactive potential in response to the third node N3 being at the active potential. Specifically, as shown in FIG. 3, the node control circuit 240 further includes a fifth transistor T5 having a gate connected to the third node N3, a first electrode connected to the second node N2, and a second electrode connected to the first reference level terminal VGL.

Figure 4:
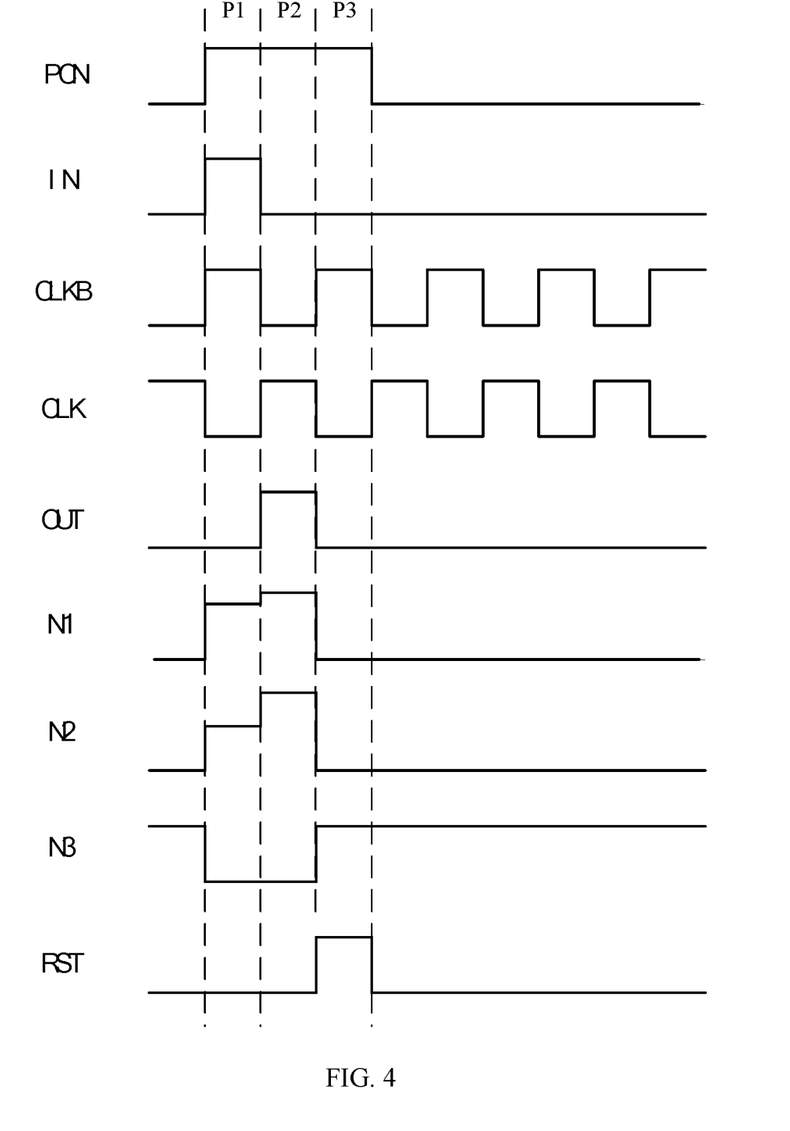
FIG. 4 is an example timing diagram for the example circuit as shown in FIG. 3.

FIG. 4 is an example timing diagram for the example circuit 200A shown in FIG. 3. The operation of the example circuit 200A of FIG. 3 is described below with reference to FIG. 4. In the following, a high level is indicated by 1 and a low level is indicated by 0. It is also assumed that the first scan level terminal CN supplies a high level voltage and the second scan level terminal CNB and the first reference level terminal VGL supply a low level voltage.

In phase P1, PCN=1, IN=1, CLKB=1, CLK=0, RST=0. Since IN=1, the first transistor T1 is turned on and the high-level voltage from the first scan level terminal CN is transmitted to the first node N1, so that the first node N1 is set at the active potential. As PCN=1, the first control transistor TK1 is turned on and the active potential at the first node N1 is transmitted to the second node N2, so that the sixth transistor T6 is turned on. Since CLKB=1, the seventh transistor T7 is turned on. The turned-on sixth transistor T6 and seventh transistor T7 have a resistor divider effect. The sixth transistor T6 and the seventh transistor T7 are designed such that the equivalent resistance of the sixth transistor T6 is much smaller than that of the seventh transistor T7. As such, the third node N3 is set at an inactive potential. Since the first node N1 is at the active potential, the third transistor T3 is turned on and an inactive clock signal from the first clock terminal CLK is transmitted to the output terminal OUT.

In phase P2, PCN=1, IN=0, CLKB=0, CLK=1, RST=0. As PCN=1, the first control transistor TK1 remains on. Since IN=0 and CLKB=0, the first transistor T1 and the seventh transistor T7 are turned off. The first capacitor C1 keeps the second node N2 at an active potential so that the third transistor T3 and the sixth transistor T6 are turned on. The turned-on sixth transistor T6 transmits the low-level voltage from the first reference level terminal VGL to the third node N3, so that the third node N3 remains at the inactive potential. The turned-on third transistor T3 transmits an active clock signal from the first clock terminal CLK to the output terminal OUT, so that the output terminal OUT outputs an active level signal. Due to the self-boosting effect of the first capacitor C1, the potential at the second node N2 is further pulled up. As the first control transistor TK1 is turned on, the potential at the first node N1 increases with the potential at the second node N2. When the potential at the first node N1 rises to equal the gate voltage of the first control transistor TK1, the first control transistor TK1 is turned off so that the first node N1 and the second node N2 are not in conduction with each other. Therefore, the increase in the potential at the first node N1 is restricted. In this case, there may be a typical operation condition for the second transistor T2: Vgs=0 V, and Vds=14.7 V. As compared to the configuration of FIG. 1 discussed above, Vds is reduced by about a factor of two, significantly reducing the leakage current that flows through the second transistor T2. As a result, the potential at the second node N2 is less influenced by the leakage current, enabling the output terminal OUT to output a normal pulse signal.

In phase P3, PCN=1, IN=0, CLKB=1, CLK=0, RST=1. Since RST=1, the second transistor T2 is turned on and the low-level voltage from the second scan level terminal CNB is transmitted to the first node N1, so that the first node N1 is set to an inactive potential. Since PCN=1, the first control transistor TK1 is turned on and the inactive potential at the first node N1 is transmitted to the second node N2, so that the third transistor T3 and the sixth transistor T6 are turned off. Since CLKB=1, the seventh transistor T7 is turned on so that an active clock signal from the second clock terminal CLKB is transmitted to the third node N3 and the third capacitor C3 is charged. Therefore, the third node N3 is set at the active potential, and the fourth transistor T4 and the fifth transistor T5 are turned on. The turned-on fourth transistor T4 transmits the low-level voltage from the first reference level terminal VGL to the output terminal OUT so that the output terminal OUT outputs an inactive level signal.

Thereafter, the first capacitor C1 keeps the first node PU at an inactive potential, and the third capacitor C3 keeps the third node N3 at an active potential. Since the third node N3 is at the active potential, the fourth transistor T4 and the fifth transistor T5 are turned on. The turned-on fifth transistor T5 transmits the low-level voltage from the first reference level terminal VGL to the first node N1, ensuring that the first node N1 is at an inactive potential. The turned-on fourth transistor T4 transmits the low-level voltage from the first reference level terminal VGL to the output terminal OUT, ensuring that the output terminal OUT outputs an inactive level signal.

Figure 5:
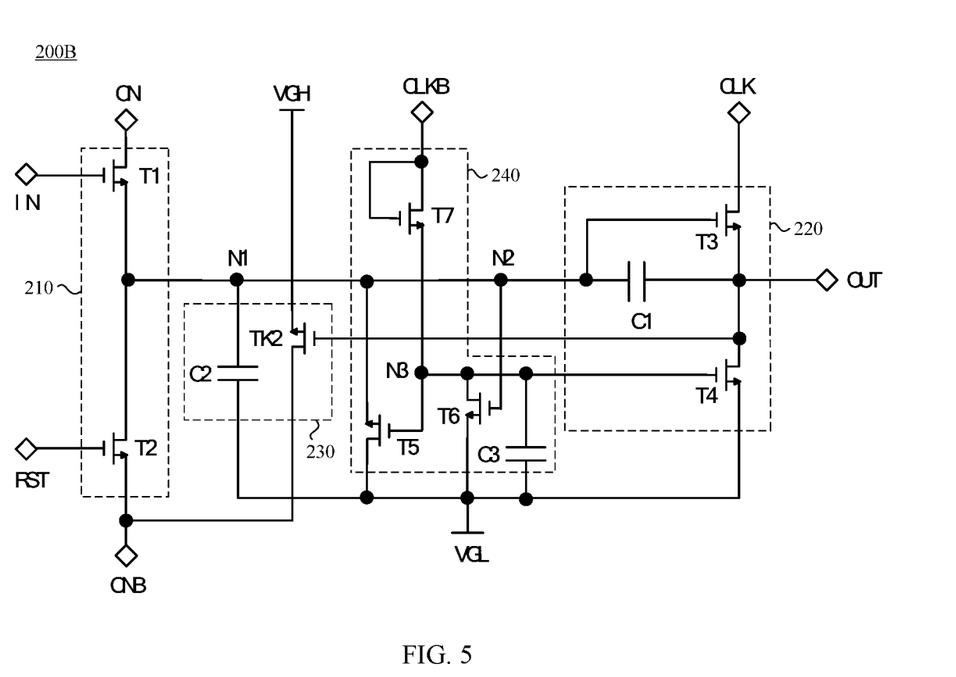
FIG. 5 is a circuit diagram of another example circuit of the shift register unit circuit as shown in FIG. 2.

FIG. 5 is a circuit diagram of another example circuit 200B of the shift register unit circuit 200 shown in FIG. 2. The configurations of the input circuit 210, the output circuit 220, and the node control circuit 240 are the same as those described above with reference to FIG. 3 and will not be repeated here.

In the example circuit 200B, the first node N1 is directly connected to the second node N2 without the first control transistor TK1 connected therebetween. Alternatively, the potential control circuit 230 includes a second capacitor C2 connected between the second node N2 and the first reference level terminal VGL for supplying the inactive potential. The second capacitor C2 is operable to maintain the potential at the first node N1 stable when the potential at the second node N2 transitions due to the self-boosting effect of the first capacitor C1. This is because the second capacitor C2 is connected in series with the first capacitor C1, and therefore the voltage transition across the first capacitor C1 can be shared. In this way, the change in the potential at the first node N1 is restricted so that the drain-source voltage Vds of the second transistor T2 is reduced as compared to the case where the second capacitor C2 is otherwise absent, thereby reducing the leakage current flowing through the second transistor T2, and in turn facilitating the stabilization of the potential at the first node N1. This may improve the reliability of the example circuit 200B under high temperature conditions.

In some embodiments, the potential control circuit 230 may be further configured to supply an active potential from the second reference level terminal VGH to the second scan level terminal CNB in response to the output terminal OUT being at the active potential. Specifically, as shown in FIG. 5, the potential control circuit 230 further includes a second control transistor TK2 having a gate connected to the output terminal OUT, a first electrode connected to the second reference level terminal VGH, and a second electrode connected to the second scan level terminal CNB. With such a configuration, the potential at the first electrode of the second transistor T2 rises synchronously when the potential at the second node N2 (equivalently, the first node N1 and the second electrode of the second transistor T2) rises due to the self-boosting effect of the first capacitor C1. This reduces the drain-source voltage Vds of the second transistor T2 and thus the leakage current flowing through the second transistor T2. This further facilitates the stabilization of the potential at the first node N1.

Figure 6:
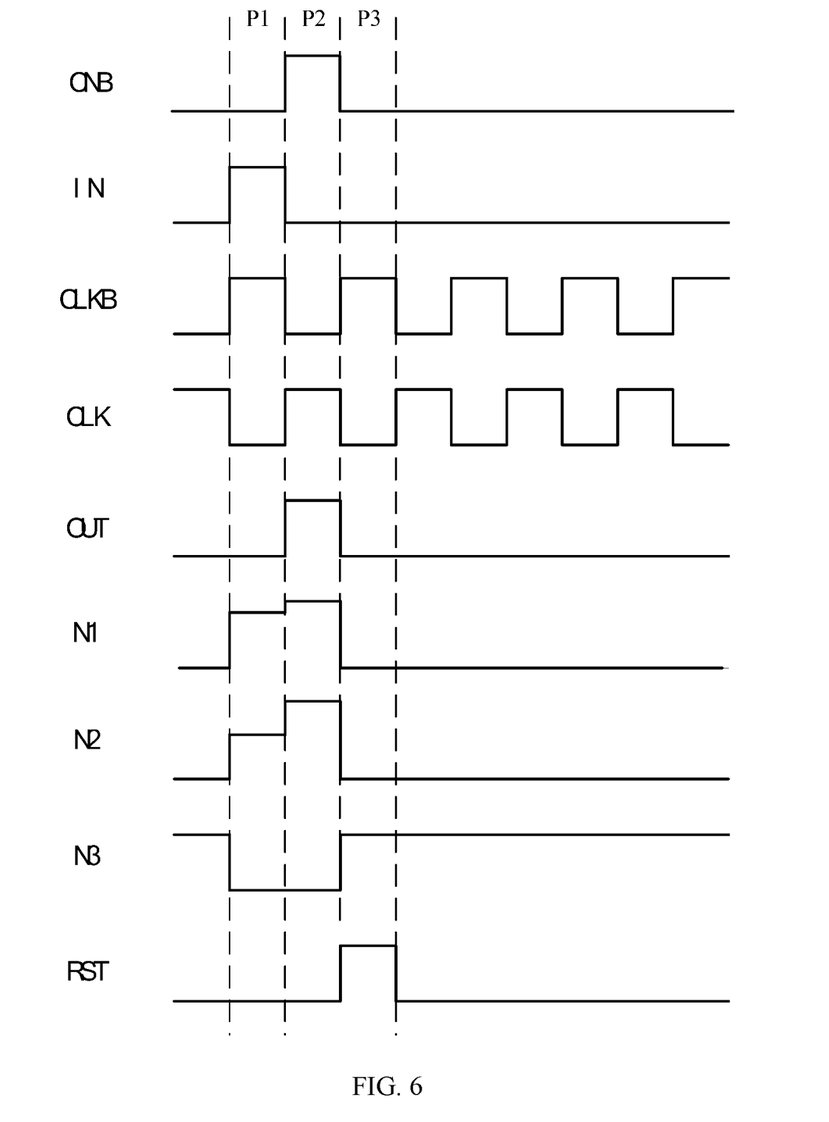
FIG. 6 is an example timing diagram for the example circuit as shown in FIG. 5.

FIG. 6 is an example timing diagram for the example circuit as shown in FIG. 5. The operation of the example circuit 200B of FIG. 5 is described below with reference to FIG. 6. In the following, a high level is indicated by 1 and a low level is indicated by 0. It is also assumed that the first scan level terminal CN and the second reference level terminal VGH supply a high level voltage and the second scan level terminal CNB and the first reference level terminal VGL supply a low level voltage.

In phase P1, IN=1, CLKB=1, CLK=0, RST=0. Since IN=1, the first transistor T1 is turned on and the high-level voltage from the first scan level terminal CN is transmitted to the first node N1, so that the first node N1 is set at the active potential. Therefore, the sixth transistor T6 is turned on. Since CLKB=1, the seventh transistor T7 is turned on. The turned-on sixth transistor T6 and seventh transistor T7 have a resistor divider effect. The sixth transistor T6 and the seventh transistor T7 are designed such that the equivalent resistance of the sixth transistor T6 is much smaller than that of the seventh transistor T7. As such, the third node N3 is set at an inactive potential. Since the first node N1 is at the active potential, the third transistor T3 is turned on and an inactive clock signal from the first clock terminal CLK is transmitted to the output terminal OUT.

In phase P2, IN=0, CLKB=0, CLK=1, RST=0. Since IN=0 and CLKB=0, the first transistor T1 and the seventh transistor T7 are turned off. The first capacitor C1 keeps the second node N2 at an active potential, so that the third transistor T3 and the sixth transistor T6 are turned on. The turned-on sixth transistor T6 transmits the low-level voltage from the first reference level terminal VGL to the third node N3 so that the third node N3 remains at the inactive potential. The turned-on third transistor T3 transmits an active clock signal from the first clock terminal CLK to the output terminal OUT so that the output terminal OUT outputs an active level signal. Due to the self-boosting effect of the first capacitor C1, the potential at the second node N2 (equivalently, the first node N1) is further pulled up. Thanks to the presence of the second capacitor C2, the increase in the potential at the first node N1 is restricted, thereby reducing the leakage current flowing through the second transistor T2.

In phase P3, IN=0, CLKB=1, CLK=0, RST=1. Since RST=1, the second transistor T2 is turned on and the low-level voltage from the second scan level terminal CNB is transmitted to the first node N1, so that the first node N1 (equivalently, the second node N2) is set at the inactive potential. Therefore, the third transistor T3 and the sixth transistor T6 are turned off. Since CLKB=1, the seventh transistor T7 is turned on so that an active clock signal from the second clock terminal CLKB is transmitted to the third node N3 and the third capacitor C3 is charged. Therefore, the third node N3 is set at the active potential, and the fourth transistor T4 and the fifth transistor T5 are turned on. The turned-on fourth transistor T4 transmits the low-level voltage from the first reference level terminal VGL to the output terminal OUT so that the output terminal OUT outputs an inactive level signal.

Thereafter, the first capacitor C1 keeps the first node PU at an inactive potential, and the third capacitor C3 keeps the third node N3 at an active potential. Since the third node N3 is at the active potential, the fourth transistor T4 and the fifth transistor T5 are turned on. The turned-on fifth transistor T5 transmits the low-level voltage from the first reference level terminal VGL to the first node N1, ensuring that the first node N1 is at an inactive potential. The turned-on fourth transistor T4 transmits the low-level voltage from the first reference level terminal VGL to the output terminal OUT, ensuring that the output terminal OUT outputs an inactive level signal.

Figure 7A:
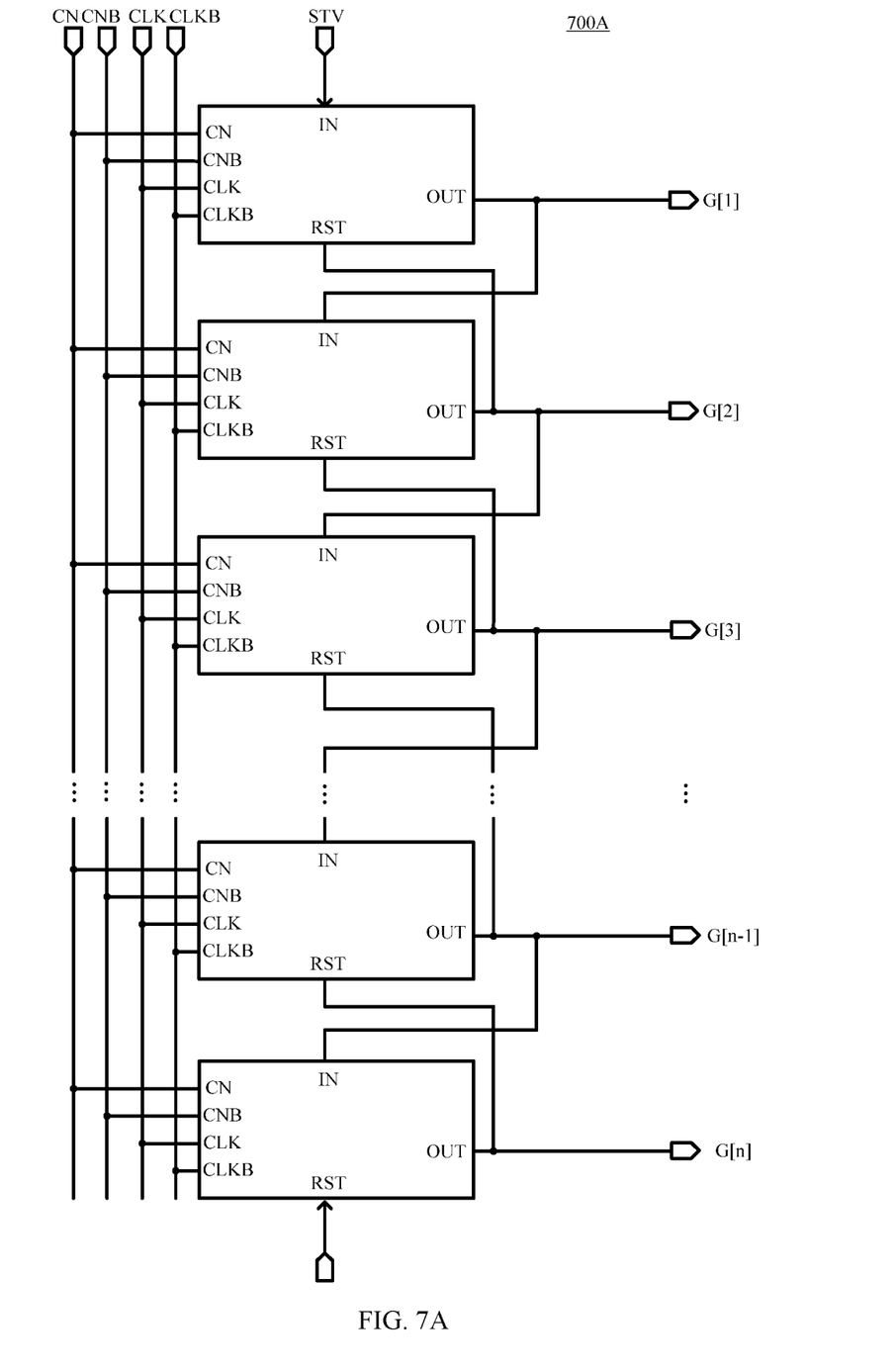
FIGS. 7A and 7B are block diagrams of a gate drive circuit according to an embodiment of the present disclosure in different scan modes.
Figure 7B:
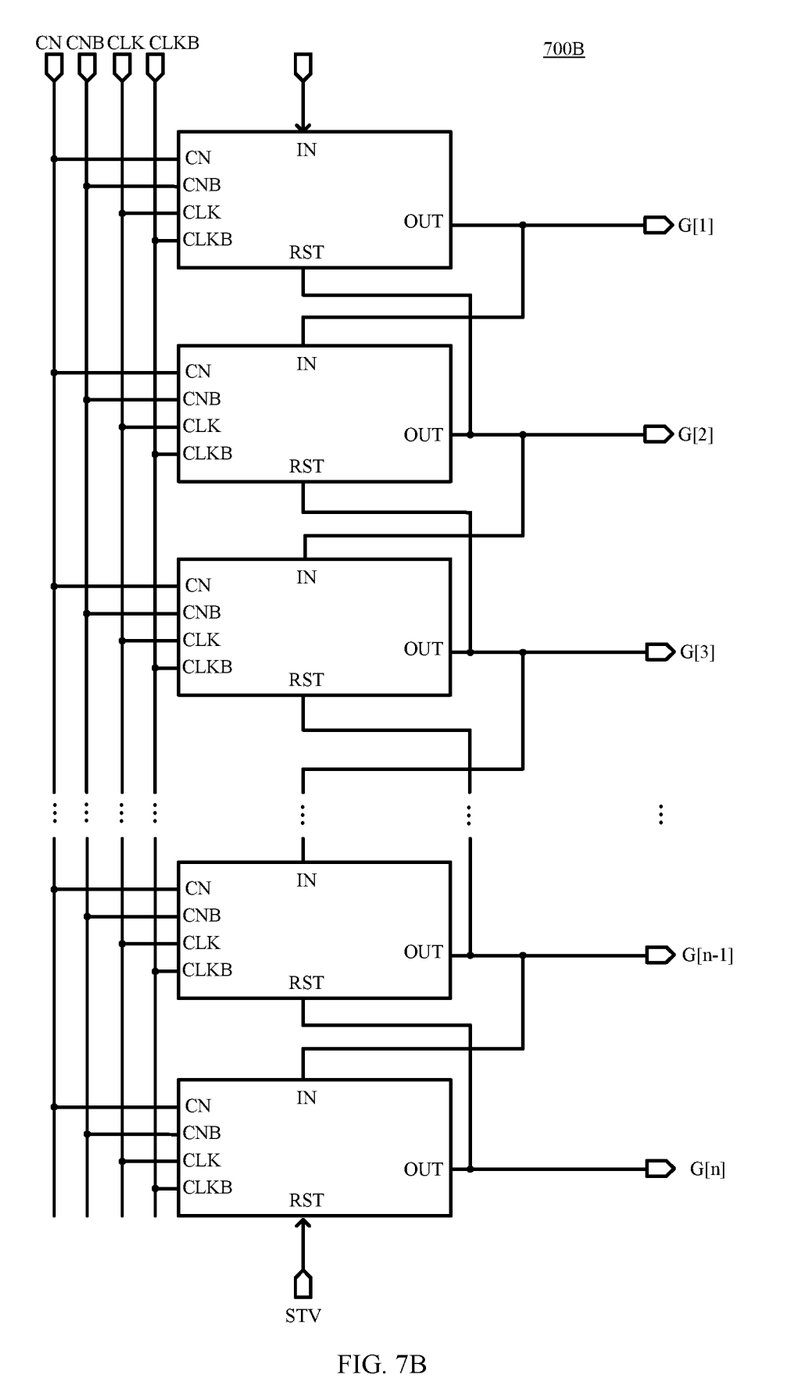

FIGS. 7A and 7B are block diagrams of a gate drive circuit according to an embodiment of the present disclosure in different scan modes. Referring to FIGS. 7A and 7B, the gate drive circuits 700A, 700B each include n cascaded shift register unit circuits, each of which may be the shift register unit circuit 200 as described above. These n shift register unit circuits are connected to n gate lines G[1], G[2], G[3], . . . , G[n−1] and G[n], respectively, to supply them with gate drive signals. n may be an integer greater than or equal to two.

Except for the first one of the shift register unit circuits, the input terminal IN of each of the shift register unit circuits is connected to the output terminal OUT of an adjacent previous shift register unit circuit, and except for the n-th shift register unit circuit, the reset terminal RST of each of the shift register unit circuits is connected to the output terminal OUT of an adjacent next shift register unit circuit.

In a forward scan mode (FIG. 7A), the input terminal IN of the first shift register unit circuit receives a start signal STV as the input pulse. In a reverse scan mode (FIG. 7B), the reset terminal RST of the n-th shift register unit circuit receives the start signal STV as the input pulse.

It will be understood that, depending on the scan mode, the input terminal IN and the reset terminal RST of the shift register unit circuit are used interchangeably, and the first scan level terminal CN and the second scan level terminal CNB are used interchangeably. In the forward scan mode, the first scan level terminal CN supplies an active level voltage, the second scan level terminal CNB supplies an inactive potential voltage, and the input terminal IN and the reset terminal RST are normally used. In the reverse scan mode, the first scan level terminal CN supplies an inactive potential voltage, and the second scan level terminal CNB supplies an active level voltage. In this case, as shown in FIG. 7B, the input terminal IN functions as a "reset terminal" and the reset terminal RST functions as an "input terminal."

Figure 8:
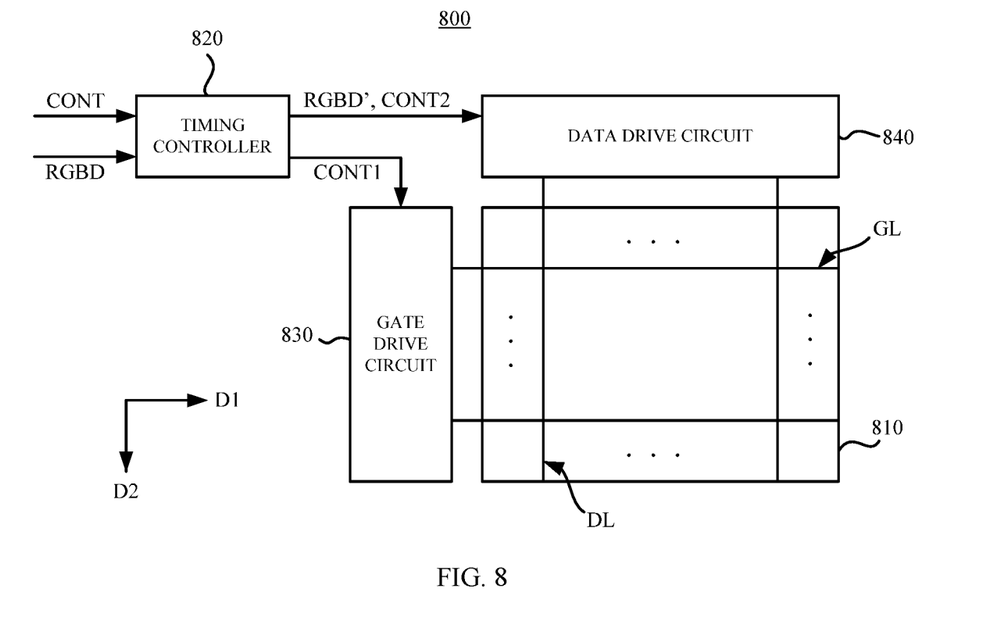
FIG. 8 is a block diagram of a display device according to an embodiment of the present disclosure.

FIG. 8 is a block diagram of a display device 800 according to an embodiment of the present disclosure. Referring to FIG. 8, the display device 800 includes a display panel 810, a timing controller 820, a gate drive circuit 830, and a data drive circuit 840. The gate drive circuit 830 may be the gate drive circuit 700A or 700B described above with respect to FIGS. 7A and 7B.

The display panel 810 is connected to a plurality of gate lines GL and a plurality of data lines DL. The display panel 810 displays an image having a plurality of grayscales based on output image data RGBD'. The gate lines GL may extend in a first direction D1 and the data lines DL may extend in a second direction D2 that intersects (e.g., is substantially perpendicular to) the first direction D1. The display panel 810 may include a plurality of pixels (not shown) arranged in a matrix. Each of the pixels may be electrically connected to a corresponding one of the gate lines GL and a corresponding one of the data lines DL. The display panel 810 may be a liquid crystal display panel, an organic light emitting diode (OLED) display panel, or other suitable type of display panel.

The timing controller 820 controls the operation of the display panel 810, the gate drive circuit 830, and the data drive circuit 840. The timing controller 820 receives input image data RGBD and input control signals CONT from an external device (for example, a host). The input image data RGBD may include a plurality of input pixel data for a plurality of pixels. Each input pixel data may include red, green, and blue grayscale data R, and B for a corresponding one of the plurality of pixels. The input control signals CONT may include a main clock signal, a data enable signal, a vertical synchronization signal, a horizontal synchronization signal, and the like. The timing controller 720 generates the output image data RGBD', a first control signal CONT1, and a second control signal CONT2 based on the input image data RGBD and the input control signals CONT.

The gate drive circuit 830 receives the first control signal CONT1 from the timing controller 820. The gate drive circuit 830 generates a plurality of gate signals for driving the gate lines GL based on the first control signal CONT1. The gate drive circuit 830 may sequentially apply the plurality of gate signals to the gate lines GL.

The data drive circuit 840 receives the second control signal CONT2 and the output image data RGBD' from the timing controller 820. The data drive circuit 840 generates a plurality of data voltages (e.g., analog data voltages) based on the second control signal CONT2 and the output image data RGBD' (e.g., digital image data). The data drive circuit 840 may apply the plurality of data voltages to the data lines DL.

In some exemplary embodiments, the gate drive circuit 830 and/or the data drive circuit 840 may be disposed (e.g., directly mounted) on the display panel 810 or may be connected to the display panel 810 by means of, for example, a Tape Carrier Package (TCP). In some embodiments, the gate drive circuit 830 and/or the data drive circuit 840 may be integrated in the display panel 810.

Examples of the display device 800 include, but are not limited to, mobile phones, tablets, televisions, monitors, laptops, digital photo frames, and navigators.

It will be understood that while the transistors are illustrated and described as n-type transistors in the above embodiments, p-type transistors are possible. In the case of a p-type transistor, the gate-on voltage has a low level and the gate-off voltage has a high level. In various embodiments, the transistors may, for example, be thin film transistors, which are typically fabricated such that their first and second electrodes are used interchangeably. Other embodiments are also contemplated.

The foregoing is specific embodiments of the present disclosure and should not be construed as limiting the scope of the present disclosure. Various modifications and changes to the described embodiments may be made by those of ordinary skill in the art without departing from the spirit of the present disclosure. Such variations and modifications shall also be regarded as within the scope of the present disclosure.

What is claimed is:

1. A shift register unit circuit, comprising: an input circuit configured to supply an active potential from a first scan level terminal to a first node in response to an input pulse from an input terminal being active, and to supply an inactive potential from a second scan level terminal to the first node in response to a reset pulse from a reset terminal being active; an output circuit configured to supply a first clock signal from a first clock terminal to an output terminal in response to a second node being at the active potential, and to cause a potential at the second node to be changed from the active potential to further away from the inactive potential in response to a potential at the output terminal transitioning from the inactive potential to the active potential; and a potential control circuit configured to restrict a change in a potential at the first node caused by the transition of the potential at the output terminal from the inactive potential to the active potential control circuit comprises a second capacitor connected between the second node and a first reference level terminal for supplying the inactive potential; wherein the potential control circuit is further configured to supply an active potential from a second reference level terminal to the second scan level terminal in response to the output terminal being at the active potential; and wherein the potential control circuit further comprises a control transistor having a gate connected to the output terminal, a first electrode connected to the second reference level terminal, and a second electrode connected to the second scan level terminal.

2. The shift register unit circuit of claim 1, wherein the input circuit comprises:
a first transistor having a gate connected to the input terminal, a first electrode connected to the first node, and a second electrode connected to the first scan level terminal; and
a second transistor having a gate connected to the reset terminal, a first electrode connected to the second scan level terminal, and a second electrode connected to the first node.

3. The shift register unit circuit of claim 1, wherein the output circuit comprises:
a third transistor having a gate connected to the second node, a first electrode connected to the output terminal, and a second electrode connected to the first clock terminal; and
a first capacitor connected between the second node and the output terminal.

4. The shift register unit circuit of claim 3, wherein the output circuit is further configured to supply the inactive potential from the first reference level terminal to the output terminal in response to a third node being at the active potential.

5. The shift register unit circuit of claim 4, wherein the output circuit further comprises a fourth transistor having a gate connected to the third node, a first electrode connected to the first reference level terminal, and a second electrode connected to the output terminal.

6. The shift register unit circuit of claim 4, further comprising a node control circuit configured to set the third node at the inactive potential in response to the second node being at the active potential and to set the third node at the active potential in response to the second node being at the inactive potential.

7. The shift register unit circuit of claim 6, wherein the node control circuit comprises:
a sixth transistor having a gate connected to the second node, a first electrode connected to the first reference level terminal, and a second electrode connected to the third node;
a seventh transistor having a gate connected to a second clock terminal for supplying a second clock signal having an opposite phase to the first clock signal, a first electrode connected to the third node, and a second electrode connected to the second clock terminal; and
a third capacitor connected between the third node and the first reference level terminal.

8. The shift register unit circuit of claim 6, wherein the node control circuit is further configured to set the second node at the inactive potential in response to the third node being at the active potential.

9. The shift register unit circuit of claim 8, wherein the node control circuit further comprises a fifth transistor having a gate connected to the third node, a first gate connected to the second node, and a second electrode connected to the first reference level terminal.

10. A method of driving a shift register unit circuit, the shift register unit circuit comprising: an input circuit configured to supply an active potential from a first scan level terminal to a first node in response to an input pulse from an input terminal being active, and to supply an inactive potential from a second scan level terminal to the first node in response to a reset pulse from a reset terminal being active, an output circuit configured to supply a first clock signal from a first clock terminal to an output terminal in response to a second node being at the active potential, and to cause a potential at the second node to be changed from the active potential to further away from the inactive potential in response to a potential at the output terminal transitioning from the inactive potential to the active potential; and a potential control circuit configured to restrict a change in a potential at the first node caused by the transition of the potential at the output terminal from the inactive potential to the active potential, wherein the first node is directly connected to the second node, and wherein the potential control circuit comprises a second capacitor connected between the second node and a first reference level terminal for supplying the inactive potential: wherein the potential control circuit is further configured to supply an active potential from a second reference level terminal to the second scan level terminal in response to the output terminal being at the active potential; and wherein the potential control circuit further comprises a control transistor having a gate connected to the output terminal, a first electrode connected to the second reference level the method comprising: responsive to the input pulse from the input terminal being active, supplying the active potential from the first scan level terminal to the first node; responsive to the second node being at the active potential, supplying the first clock signal from the first clock terminal to the output terminal; responsive to the output terminal transitioning from being at the inactive potential to being at the active potential, causing the potential at the second node to be changed from the active potential to further away from the inactive potential; restricting a change in the potential at the first node caused by the transition of the potential at the output terminal from the inactive potential to the active potential; and responsive to the reset pulse from the reset terminal being active, supplying the inactive potential from the second scan level terminal to the first node.

11. The method of claim 10, further comprising supplying an active potential from a second reference level terminal to the second scan level terminal in response to the output terminal being at the active potential.

12. A gate drive circuit comprising a plurality of cascaded shift register unit circuits as claimed in claim 1.

13. A display device comprising the gate drive circuit of claim 12.

* * * * *

UNITED STATES PATENT AND TRADEMARK OFFICE
CERTIFICATE OF CORRECTION

Page 1 of 2

PATENT NO.         : 10,706,767 B2
APPLICATION NO.    : 15/756975
DATED              : July 7, 2020
INVENTOR(S)        : Fan et al.

It is certified that error appears in the above-identified patent and that said Letters Patent is hereby corrected as shown below:

On the Title Page

In Item (73), Line 5, please delete "(MN)" and insert --(CN)--.

In the Claims

Column 11, Line 15, cancel the text beginning with "1. A shift register unit circuit," to and ending with "second scan level terminal." in Column 11, Line 42 and insert the following claim:
--1. A shift register unit circuit, comprising:
 an input circuit configured to supply an active potential from a first scan level terminal to a first node in response to an input pulse from an input terminal being active, and to supply an inactive potential from a second scan level terminal to the first node in response to a reset pulse from a reset terminal being active;
 an output circuit configured to supply a first clock signal from a first clock terminal to an output terminal in response to a second node being at the active potential, and to cause a potential at the second node to be changed from the active potential to further away from the inactive potential in response to a potential at the output terminal transitioning from the inactive potential to the active potential; and
 a potential control circuit configured to restrict a change in a potential at the first node caused by the transition of the potential at the output terminal from the inactive potential to the active potential,
 wherein the first node is directly connected to the second node, and wherein the potential control circuit comprises a second capacitor connected between the second node and a first reference level terminal for supplying the inactive potential;
 wherein the potential control circuit is further configured to supply an active potential from a second reference level terminal to the second scan level terminal in response to the output terminal being at the active potential; and
 wherein the potential control circuit further comprises a control transistor having a gate connected to the output terminal, a first electrode connected to the second Signed and Sealed this
Eighth Day of December, 2020

Andrei Iancu
*Director of the United States Patent and Trademark Office* reference level terminal, and a second electrode connected to the second scan level terminal.--

Column 12, Line 32, cancel the text beginning with "10. A method of driving" to and ending with "to the first node." in Column 13, Line 8 and insert the following claim:
--15. A method of driving a shift register unit circuit, the shift register unit circuit comprising:

an input circuit configured to supply an active potential from a first scan level terminal to a first node in response to an input pulse from an input terminal being active, and to supply an inactive potential from a second scan level terminal to the first node in response to a reset pulse from a reset terminal being active;

an output circuit configured to supply a first clock signal from a first clock terminal to an output terminal in response to a second node being at the active potential, and to cause a potential at the second node to be changed from the active potential to further away from the inactive potential in response to a potential at the output terminal transitioning from the inactive potential to the active potential; and a potential control circuit configured to restrict a change in a potential at the first node caused by the transition of the potential at the output terminal from the inactive potential to the active potential, wherein the first node is directly connected to the second node, and wherein the potential control circuit comprises a second capacitor connected between the second node and a first reference level terminal for supplying the inactive potential;

wherein the potential control circuit is further configured to supply an active potential from a second reference level terminal to the second scan level terminal in response to the output terminal being at the active potential; and wherein the potential control circuit further comprises a control transistor having a gate connected to the output terminal, a first electrode connected to the second reference level terminal, and a second electrode connected to the second scan level terminal, the method comprising:

responsive to the input pulse from the input terminal being active, supplying the active potential from the first scan level terminal to the first node;

responsive to the second node being at the active potential, supplying the first clock signal from the first clock terminal to the output terminal;

responsive to the output terminal transitioning from being at the inactive potential to being at the active potential, causing the potential at the second node to be changed from the active potential to further away from the inactive potential;

restricting a change in the potential at the first node caused by the transition of the potential at the output terminal from the inactive potential to the active potential; and responsive to the reset pulse from the reset terminal being active, supplying the inactive potential from the second scan level terminal to the first node.--